US011460493B2

(12) United States Patent
Routu et al.

(10) Patent No.: US 11,460,493 B2
(45) Date of Patent: Oct. 4, 2022

(54) ELECTRIC ENERGY METER WITH ON-BOARD POWER QUALITY ANALYTICS

(71) Applicant: Honeywell International Inc., Morris Plains, NJ (US)

(72) Inventors: Ramachandra Rao Routu, Hyderabad (IN); Anil Madhav Bhide, Hyderabad (IN); Siva Sagar Kuricheti, Hyderabad (IN); Krishna Mohan, Hyderabad (IN); Shalu Singhvi, Hyderabad (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 17/132,919

(22) Filed: Dec. 23, 2020

(65) Prior Publication Data

US 2022/0196715 A1    Jun. 23, 2022

(51) Int. Cl.
*G01R 22/06* (2006.01)
*G01R 31/42* (2006.01)
*G01R 21/133* (2006.01)

(52) U.S. Cl.
CPC ....... *G01R 22/068* (2013.01); *G01R 21/1333* (2013.01); *G01R 22/063* (2013.01); *G01R 31/42* (2013.01)

(58) Field of Classification Search
CPC ... Y04S 20/30; G01R 21/133; G01R 21/1333; G01R 21/1331; G01R 22/063;
(Continued)

(56) References Cited

U.S. PATENT DOCUMENTS 9,075,088 B2    7/2015 Yang et al.
10,275,840 B2    4/2019 Kagan et al.
(Continued)

FOREIGN PATENT DOCUMENTS

EP    2088437 A1    8/2009
EP    3223022 A1    9/2017

OTHER PUBLICATIONS

Music et al; "Integrated power quality monitoring system and the benefits of integrating smart meters," 2013 International Conference—Workshop Compatibility And Power Electronics, Ljubljana, Slovenia, pp. 86-91, 2013.
(Continued)

*Primary Examiner* — Giovanni Astacio-Oquendo
(74) *Attorney, Agent, or Firm* — Seager, Tufte & Wickhem, LLP

(57) ABSTRACT

An electric energy meter includes a plurality of first terminals for receiving a measure of current of each of one or more phases of power and a plurality of second terminals for receiving a measure of voltage of each of one or more phases of power. A controller is configured to analyze the measure of current and the measure of voltage of each of the one or more phases of power in order to detect power quality issues in one or more of the one or more phases of power. For each of the detected power quality issues, the controller is configured to determine whether the detected power quality issue is caused by a utility generating the power or a consumer consuming the power and to communicate a message indicating the detected power quality issues via a communications port operably coupled to the controller.

20 Claims, 5 Drawing Sheets

(58) Field of Classification Search
CPC .. G01R 22/068; G01R 31/42; G01R 19/2513; Y02B 90/20; G01D 4/002
See application file for complete search history.

(56) References Cited

U.S. PATENT DOCUMENTS

| | | |
|---|---|---|
| 11,187,734 B2* | 11/2021 | Karlgaard ............ G01R 22/065 |
| 11,237,194 B2* | 2/2022 | Tanwani .................... H02J 7/34 |
| 11,300,424 B2* | 4/2022 | Banhegyesi ............. G01R 1/04 |
| 2003/0014200 A1* | 1/2003 | Jonker ................. G01R 21/133 |
| | | 702/60 |
| 2009/0228224 A1 | 9/2009 | Spanier et al. |
| 2015/0331035 A1* | 11/2015 | Li .......................... G06Q 50/06 |
| | | 702/59 |

OTHER PUBLICATIONS

Ramos et al; "Smart-meter in power quality," 2017 International Young Engineers Forum (YEF-ECE), Almada, pp. 42-46, 2017.
Extended European Search Report, EP Application No. 21215821.6, dated May 23, 2022 (10 pages).

* cited by examiner

ELECTRIC ENERGY METER WITH ON-BOARD POWER QUALITY ANALYTICS

TECHNICAL FIELD

The present disclosure relates generally to power systems and more particularly to electric energy meters used for monitoring delivered energy to such power systems.

BACKGROUND

Power systems are used to provide necessary power to a wide variety of building systems such as but not limited to lighting systems, security systems, HVAC systems and general power requirements. In some cases, electric energy meters are used to monitor a power system in order to detect potential problems with the power system. Electric energy meters are also used to measure power consumption for billing purposes. A variety of electric energy meters are known. Improvements in the use and functionality of electric energy meters would be desirable.

SUMMARY

The present disclosure relates generally to power systems and more particularly to electric energy meters used for monitoring delivered energy to such power systems. A particular example of the present disclosure is an electric energy meter that includes a plurality of first terminals for receiving a measure of current of each of one or more phases of power that is delivered to a load and a plurality of second terminals for receiving a measure of voltage of each of one or more phases of power that is delivered to the load. A controller is operatively coupled to the plurality of first terminals and the plurality of second terminals and is configured to analyze the measure of current and the measure of voltage of each of the one or more phases of power that is delivered to the load to determine a measure of accumulated power delivered to the load and to determine one or more power quality issues in one or more of the one or more phases of power that is delivered to the load, if any. An accumulated power register is operatively coupled to the controller for storing the measure of accumulated power delivered to the load. A plurality of power quality monitor registers are operably coupled to the controller. The controller is configured to save indications of each of a plurality of different power quality issues in a corresponding one of the plurality of power quality monitor registers. A communications port is operably coupled to the controller and is configured to communicate with an external device. The controller is configured to communicate the measure of accumulated power delivered to the load and communicate an indication of each of one or more of the plurality of different power quality issues via the communication port.

Another example of the present disclosure is an electric energy meter that includes a plurality of terminals for receiving a measure of power consumption for each of one or more phases of power that is delivered to a load. A controller is operatively coupled to the plurality of terminals and is configured to analyze the measure of power consumption for each of one or more phases of power that is delivered to the load to determine a measure of accumulated power delivered to the load and to determine one or more power quality issues in one or more phases of power that is delivered to the load, if any. An accumulated power register is operatively coupled to the controller for storing the measure of accumulated power delivered to the load. A plurality of power quality monitor registers are operably coupled to the controller, where the controller saves indications of each of a plurality of different power quality issues in a corresponding one of the plurality of power quality monitor registers. A communication port is operably coupled to the controller and is configured to communicate with an external device. The controller is configured to communicate the measure of accumulated power delivered to the load and communicate an indication of each of one or more of the plurality of different power quality issues via the communication port.

Another example of the present disclosure is an electric energy meter that includes a plurality of first terminals for receiving a measure of current of each of one or more phases of power that is delivered to a load and a plurality of second terminals for receiving a measure of voltage of each of one or more phases of power that is delivered to the load. A controller is operatively coupled to the plurality of first terminals and the plurality of second terminals and is configured to analyze the measure of current and the measure of voltage of each of the one or more phases of power that is delivered to the load in order to detect power quality issues in one or more of the one or more phases of power that is delivered to the load. For each of the detected power quality issues, the controller is configured to determine whether the detected power quality issue is caused by a utility (i.e. the utility delivery the power) or a consumer (i.e. consumer consuming the power) and to communicate a message indicating the detected power quality issues via a communications port operably coupled to the controller.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which.

Figure 1:
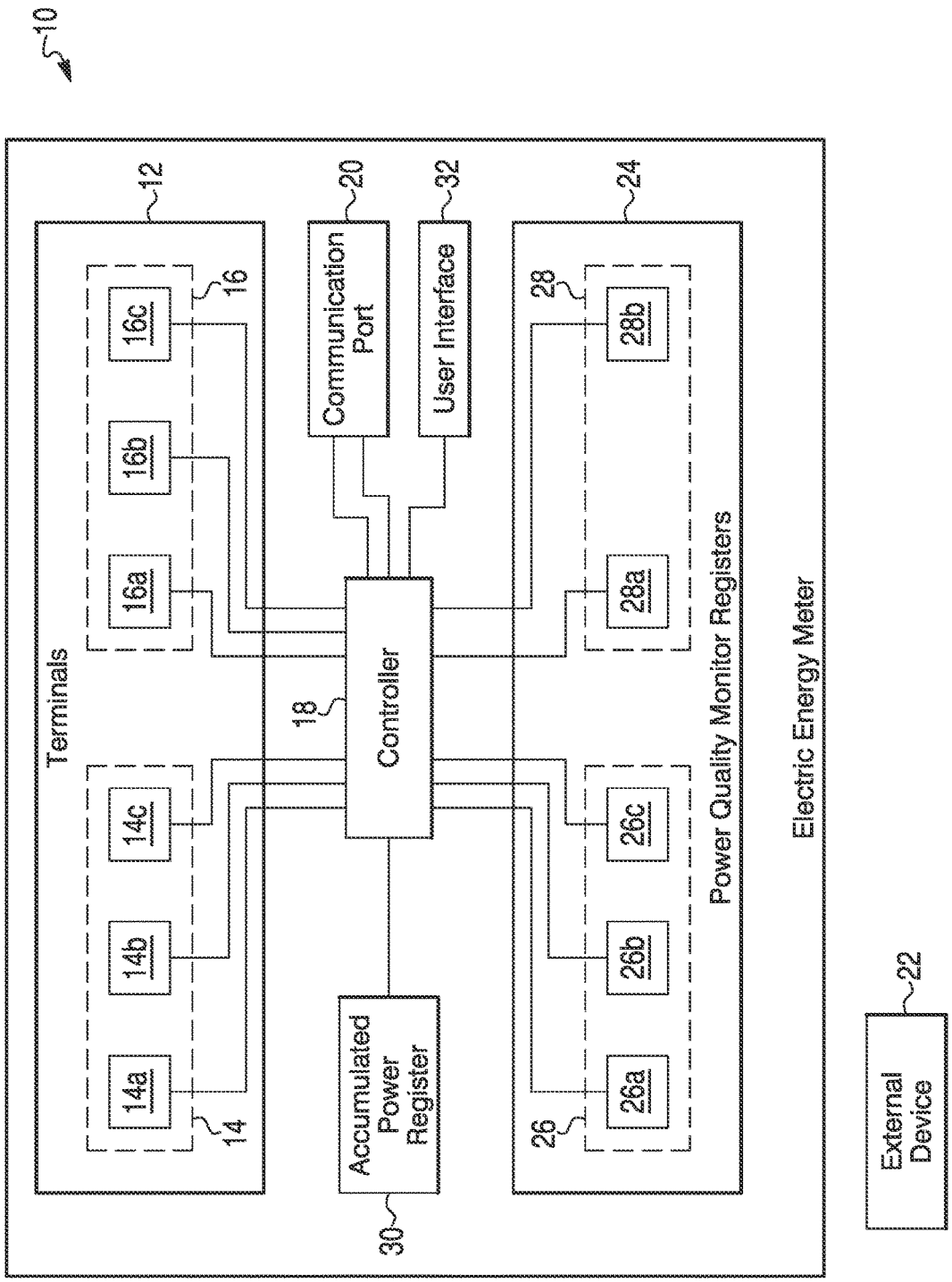
FIG. 1 is a schematic block diagram of an illustrative electric energy meter.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic is described in connection with an embodiment, it is contemplated that the feature, structure, or characteristic may be applied to other embodiments whether or not explicitly described unless clearly stated to the contrary.

The disclosure generally pertains to electric energy meters. Electric energy meters of the present disclosure may be used to measure and monitor energy that is delivered to any number of different power consumption devices, or loads. The electric energy meters may be configured to determine the quantity and quality of the power being delivered to the load. In some cases, the electric energy meters may be configured to measure the current and voltage being delivered to a load such that a power utility can bill a consumer for the power they have used. In some cases, an electric energy meter may be considered as being a direct electric energy meter, meaning that the electric energy meter is directly spliced into a conductor providing power to the load. In some instances, the electric energy meter may be considered as being an indirect electric energy meter or a CT (current transformer) electric energy meter in which a CT is used to provide an indication of current flowing to a load and a line voltage tap is used to provide an indication of the voltage. It will be appreciated that many of the features discussed herein are equally applicable to direct electric energy meters and to indirect or CT electric energy meters. In some cases, the electric energy meters of the present disclosure may provide a measure of power in each of the three phases in a three-phase power line.

FIG. 1 is a schematic block diagram of an illustrative electric energy meter 10. In some cases, the electric energy meter 10 may be referred to as a power meter. The electric energy meter 10 may be configured to be installed at a consumer's location, where the power is being consumed. The electric energy meter 10 may represent a direct electric energy meter or an indirect or CT electric energy meter, as noted above. The illustrative electric energy meter 10 includes a plurality of terminals 12 that may be configured for receiving a measure of power consumption for each of one or more phases of power that is delivered to a load. If the electric energy meter 10 is a direct meter, the plurality of terminals 12 may be configured to accommodate a LINE IN conductor and a LINE out conductor, with the electric energy meter 10 disposed therebetween. If the electric energy meter 10 is an indirect meter, the plurality of terminals 12 may be configured to accommodate a wire or cable providing a measure of voltage as well as wires or cables extending from a current transformer (CT) or the like that provides a measure of current passing to the load.

In some cases, as will be discussed, the plurality of terminals 12 may be considered as being divided into a one or more first terminals 14 and a one or more second terminals 16. While the one or more first terminals 14 is shown as including a terminal 14a, a terminal 14b and a terminal 14c, and the one or more second terminals 16 is shown as including a terminal 16a, a terminal 16b and a terminal 16c, it will be appreciated that this is merely illustrative. In some cases, the one or more first terminals 14 may only include one terminal or two terminals, or may include four or more terminals. Similarly, the one or more second terminals 16 may include only one terminal or two terminals, or may include four or more terminals. In some cases, when the electric energy meter 10 is an indirect or CT electric energy meter, the plurality of first terminals 14 may be configured for receiving a measure of current of each of one or more phases of power that is delivered to the load and the plurality of second terminals 16 may be configured for receiving a measure of voltage of each of the one or more phases of power that is delivered to the load.

A controller 18 may be operably coupled to the plurality of terminals 12 and may for example be configured to determine a number of power monitor parameters based on the measure of power consumption for each of one or more phases of power that is delivered to the load. In the example shown, the controller 18 is operably coupled to a communication port 20, such that the controller 18 is able to communicate with an external device 22. The external device 22 may represent a computing system associated with a utility generating the electricity being quantified by the electric energy meter 10. The external device 22 may represent a computing system associated with a consumer of the electrical energy, and the electric energy meter 10 may be located at the consumer's location. In some cases, the external device 22 may represent another electric power meter, or a mesh network of electric power meters. The communication port 20 may be configured to accommodate a wired connection such as but not limited to an Ethernet connection. The communication port 20 may be configured to accommodate a wireless protocol such as but not limited to Bluetooth Low Energy (BLE), Zigbee, and/or WiFi, although other wireless protocols are also contemplated.

As will be discussed in greater detail, the controller 18 may be configured to ascertain an accumulation of electrical energy delivered as well as various reliability and/or quality characteristics of the delivered electrical energy. In some cases, the controller 18 may be configured to communicate (e.g. via communication port 20) a measure of accumulated power delivered to the load as well as an indication of each of one or more of a plurality of different power quality issues. The controller 18 may be configured to analyze the measure of current of each of the phases of power delivered to the load and the measure of voltage of each of the one or more phases of power delivered to the load and determine a measure of accumulated power delivered to the load and to determine one or more power quality issues in one or more of the one or more phases of power that is delivered to the load.

As will be appreciated, reliability refers to the availability of the power supply, 24 hours per day, 7 days per week, 365 days per year. Quality refers to deviations or distortions from a pure supply waveform and continuity of supply. Any significant deviation in the magnitude, frequency, waveform or symmetry of line voltages may be considered as being a potential power quality issue. In order to be able to track and store these parameters, the illustrative electric energy meter 10 includes a plurality of power quality monitor registers 24. The power quality monitor registers 24 may be considered as being addressable locations within a memory of the electric energy meter 10. The addressable locations may be static. In some cases, the addressable locations may be dynamic, meaning that the addressable locations in memory may change in accordance with changing memory needs, or which power quality monitor registers 24 need additional memory space, for example.

In some cases, the plurality of power quality monitor registers 24 may be considered as being divided into a number of first registers 26 and a number of second registers 28. While the number of first registers 26 is shown as including a register 26a, a register 26b and a register 26c, and the number of second registers 28 is shown as including a register 28a and a register 28b, it will be appreciated that this is merely illustrative. In some cases, the number of first registers 26 may include only one register, two registers or three registers, or may include five or more registers. Similarly, the number of second registers 28 may include only one register, or may include three registers, four registers or five or more registers. The electric energy meter 10 also includes an accumulated power register 30 that is operably coupled with the controller 18 and that is configured to store a measure of accumulated power delivered to the consumer, sometimes over a period of time.

In some cases, the electric energy meter 10 may include a user interface 32. The controller 18 may be configured to display the indications of each of a plurality of different power quality issues that are collectively saved in the plurality of power quality monitor registers 24 via the user interface 32.

In some cases, the controller 18 may be configured to determine whether a particular power quality issue originated upstream of the electric energy meter 10 (e.g. utility side) or downstream (e.g. consumer side) of the electric energy meter 10. Power quality issues originating upstream of the electric energy meter 10 may be attributed to a utility that provides the power that is delivered to the load. Power quality issues originating downstream of the electric energy meter 10 may be attributed to a consumer of the power that is delivered to the load. Accordingly, some of the power quality monitor registers 24 may be used for tracking problems that originated upstream of the electric energy meter 10, and thus possibly caused by the utility (or another consumer) and others of the power quality monitor registers 24 may be used for tracking problems that are downstream of the electric energy meter 10 and thus possibly caused by the consumer. In some cases, the number of first registers 26 may be assigned to tracking utility-related problems and the number of second registers 28 may be assigned to tracking consumer-related problems.

The controller 18 may be configured to detect problems such as sag/swell, phase unbalance, short interruptions due to load, flickering due to load, harmonics and frequency. The controller 18 may be configured to ascertain whether the utility or the consumer may be at fault for the particular problems detected. For example, the controller 18 may be configured to monitor how quickly current is increasing or decreasing as well as how quickly voltage is increasing or decreasing. If the current is increasing suddenly while at the same time voltage is dropping, the controller 18 may determine that this sag is caused by the consumer. If the current is decreasing suddenly while at the same time voltage is increasing, the controller 18 may determine that this swell is caused by the consumer. If the current is unchanging while the voltage is undergoing either sag or swell, the controller 18 may determine that this being caused by the utility's distribution network.

In some cases, sag and swell may be divided into different categories such as instantaneous, momentary and temporary, as indicated in the table below. In this, "pu" represents a standard or reference voltage. In some countries and regions, the standard or reference voltage "pu" is 230 volts. In other countries and regions, the standard or reference voltage "pu" is 110 or 120 volts.

| Categories | | Typical Duration | Typical Magnitude |
|---|---|---|---|
| 2.1 Instantaneous | | | |
| | 2.1.1 Sag | 0.5-30 cycles | 0.1-0.9 pu |
| | 2.1.2 Swell | 0.5-30 cycles | 1.1-1.8 pu |
| 2.2 Momentary | | | |
| | 2.2.1 Interruption | 0.5-3 seconds | <0.1 pu |
| | 2.2.2 Sag | 0.5-3 seconds | 0.1-0.9 pu |
| | 2.2.3 Swell | 0.5-3 seconds | 1.1-1.8 pu |
| 2.3 Temporary | | | |
| | 2.3.1 Interruption | 3 sec–1 minute | <0.1 pu |
| | 2.3.2 Sag | 3 sec–1 minute | 0.1-0.9 pu |
| | 2.3.3 Swell | 3 sec–1 minute | 1.1-1.8 pu |

In some cases, the controller 18 may be configured to monitor all three phases of the current in a three-phase power line. If differences between the three phases exceeds a threshold, then the controller 18 may determine that this is caused by the consumer. For short interruptions due to loads and flickering due to loads, the logic of sag/swell can be extended to detect these as well. In some cases, PST (power short term) and PLT (power long term) can be calculated and compared with changes in current during the same time frame in order to determine if a flickering is caused by the utility or by the consumer. With respect to harmonics, the controller 18 may measure the current amplitude, change in current amplitude and any harmonics present and compare to the harmonics in voltage to determine whether the harmonics are being caused by the utility or by the consumer.

For frequency, the controller 18 may calculate and store average frequencies for an interval period. A variation of more than some threshold percent (e.g. two percent) may cause the controller 18 to identify the energy during that period using a different register 26. It will be appreciated that frequency typically indicates a mismatch between supply and demand. If the frequency is above a designated frequency, this often indicates that supply is greater than demand. If the frequency is below the designated frequency, this often indicates that supply is less than demand. In some cases, and in some power generation systems, the designated frequency may be 50 Hertz (Hz). In some power generation systems, the designated frequency may be different. For example, in the United States, the designated threshold is 60 Hz.

Figure 2:
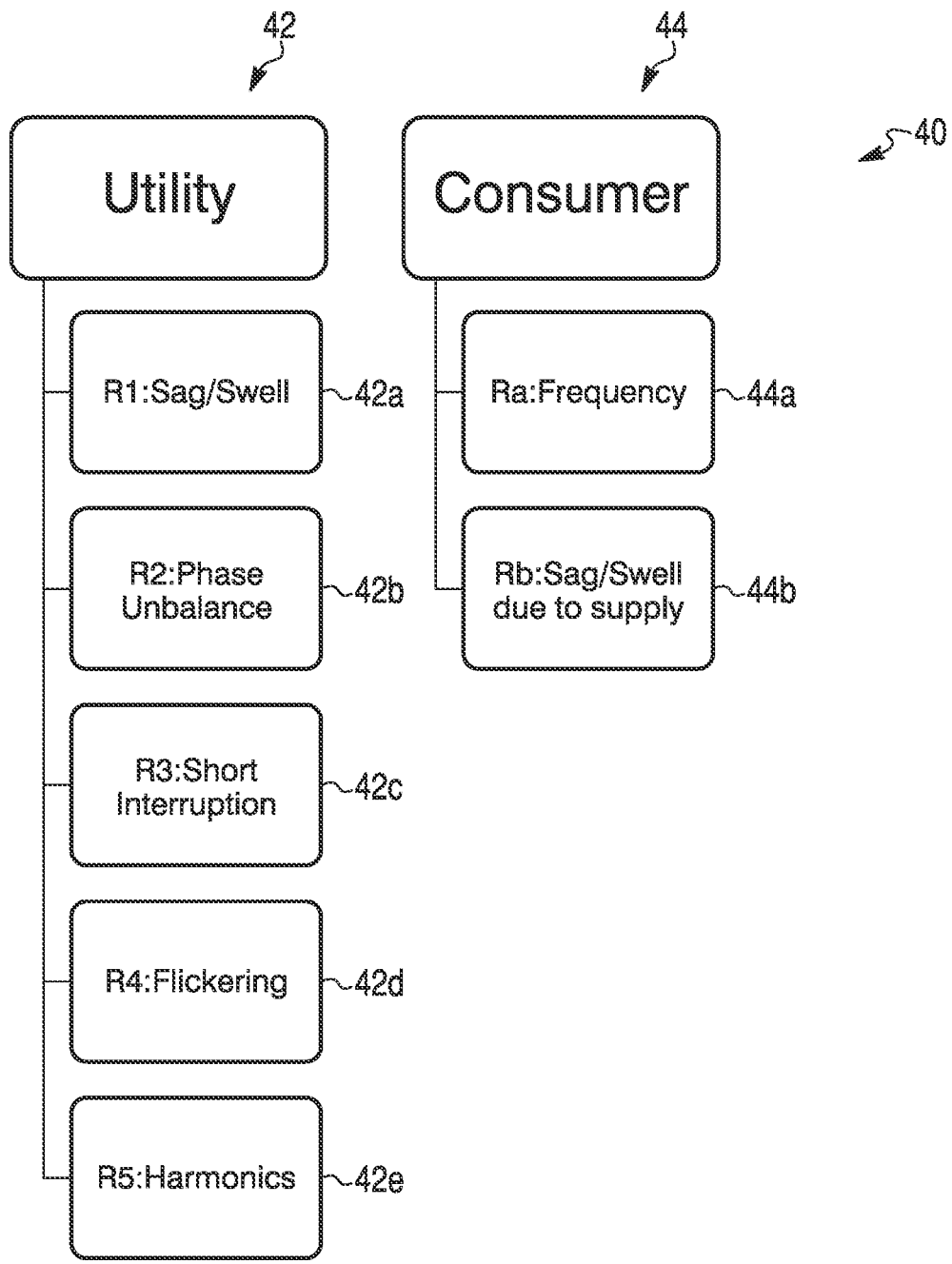
FIG. 2 is a schematic block diagram showing illustrative registers that may be used in the illustrative electric energy meter of FIG. 1.

FIG. 2 is a schematic block diagram showing illustrative registers 40 that may be used in the electric energy meter 10. The registers 40 may be considered as an example of the power quality monitor registers 24. In the example shown, the registers 40 are divided into a set of registers 42 that are dedicated to issues relating to the utility (or otherwise upstream of the electric energy meter 10) and a set of registers 44 that are dedicated to issues relating to the consumer (or otherwise downstream of the electric energy meter 10). The set of registers 42 may be considered as representative of the number of first registers 26 while the set of registers 44 may be considered as representative of the number of second registers 28, for example.

The set of registers 42 includes a register 42a that is labeled R1:Sag/Swell, a register 42b that is labeled R2:Phase Unbalance, a register 42c that is labeled R3: Short Interruption, a register 42d that is labeled R4:Flickering and a register 42e that is labeled R5:Harmonics. When the controller 18 detects a power quality issue pertaining to one of these categories and assigned to the utility, the controller 18 will store an indication of the power quality issue in the appropriate register 42. The set of registers 44 includes a register 44a that is labeled Ra: Frequency and a register 44b that is labeled Rb: Sag/swell due to supply. When the controller 18 detects a power quality issues pertaining to one of these categories and assigned to the consumer, the controller 18 will store an indication of the power quality issue in the appropriate register 44. Each register may store a value or set of values that represent an accumulation of power that was delivered to the consumer with the corresponding power quality issue. The accumulated power register 30 may store a value or set of values that represent an accumulation of total power delivered to the load.

Figure 3:
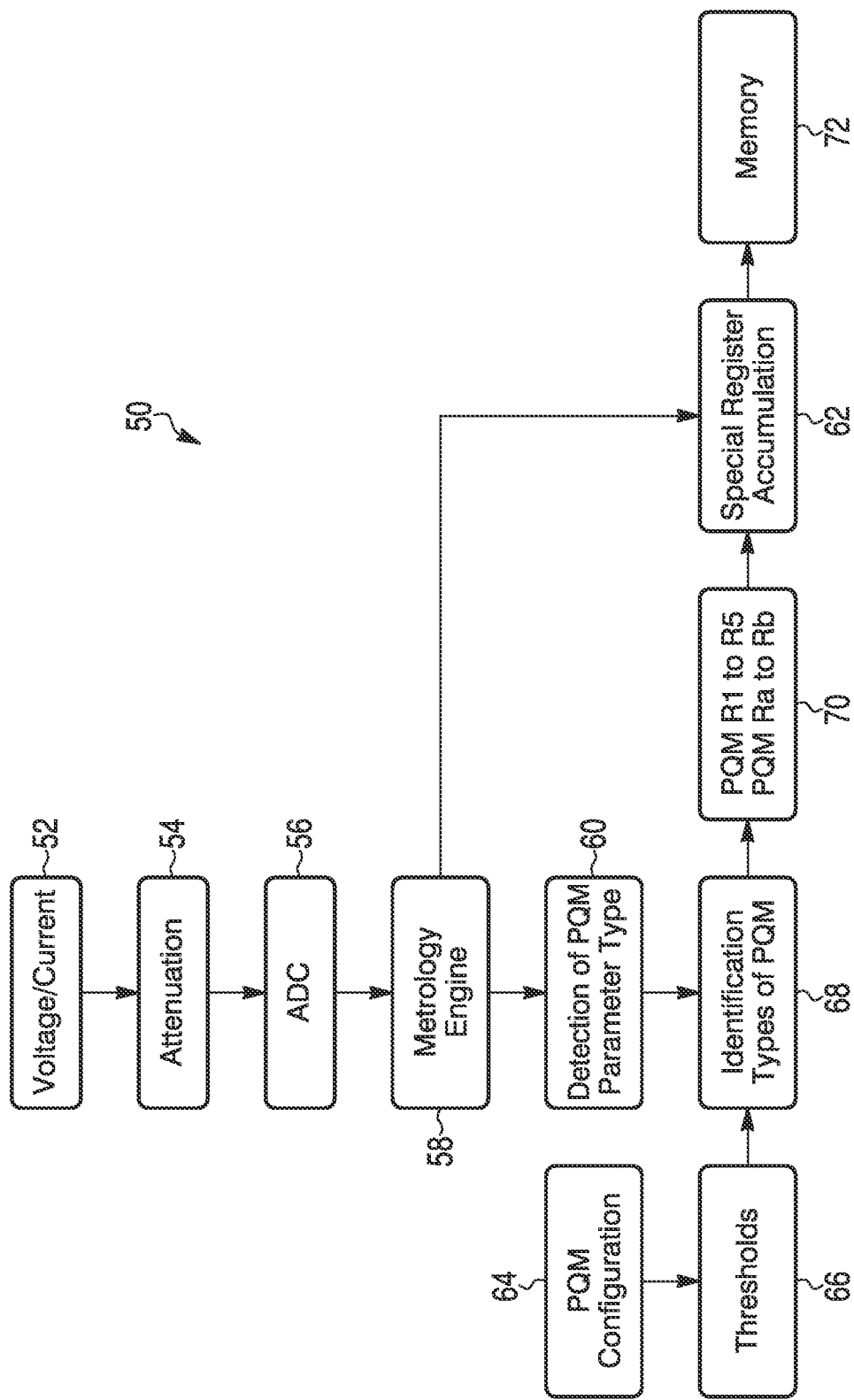
FIG. 3 is a schematic block diagram showing features of the illustrative electric energy meter of FIG. 1.

FIG. 3 is a schematic block diagram showing an architecture 50 that may be employed within the electric energy meter 10. Measurements of current and voltage, as indicated at block 52, are provided to an attenuation block 54 for attenuation if needed. The attenuated current and voltage values are provided to an ADC (analog to digital converter) block 56 and then to a Metrology engine 58, which may update a value or set of values in an accumulated power register to represent the accumulation of power delivered to the consumer. From there, control passes to a block 60, where PQM (power quality measurement) parameter types are detected in the monitored power. The PQM parameter types may include, for example, sag/swell, phase unbalance, short interruptions due to load, flickering due to load, harmonics and frequency.

Block 64 provides PQM configuration values to block 66, which stores, determines or otherwise ascertains particular threshold values for flagging certain ones of the PQM parameter types as power quality issues. Block 66 provides the thresholds values to a block 68. Block 68 uses the thresholds to identifies which of the detected PQM parameter types identified by block 60 do not meet the corresponding threshold. Depending on the detected PQM types that failed to meet the corresponding threshold, block 70 asserts a flag that corresponds to a corresponding PQM register R1 to R5 and Ra and Rb. In this example, PQM registers R1 to R5 and Ra and Rb may correspond to registers 42a-42e and 44a-44b of FIG. 2. Block 62 include PQM registers R1 to R5 and Ra and Rb, and is configured to monitor the flags asserted by block 70 to determine which if any of the PQM registers R1 to R5 and Ra and Rb should start and stop accumulating power measured by the metrology engine 58. Each PQM register R1 to R5 and Ra and Rb may store a value or set of values that represent an accumulation of power that was delivered to the consumer with the corresponding power quality issue. The accumulated value or set of values in PQM registers R1 to R5 and Ra and Rb may be save to memory via block 72.

Figure 4:
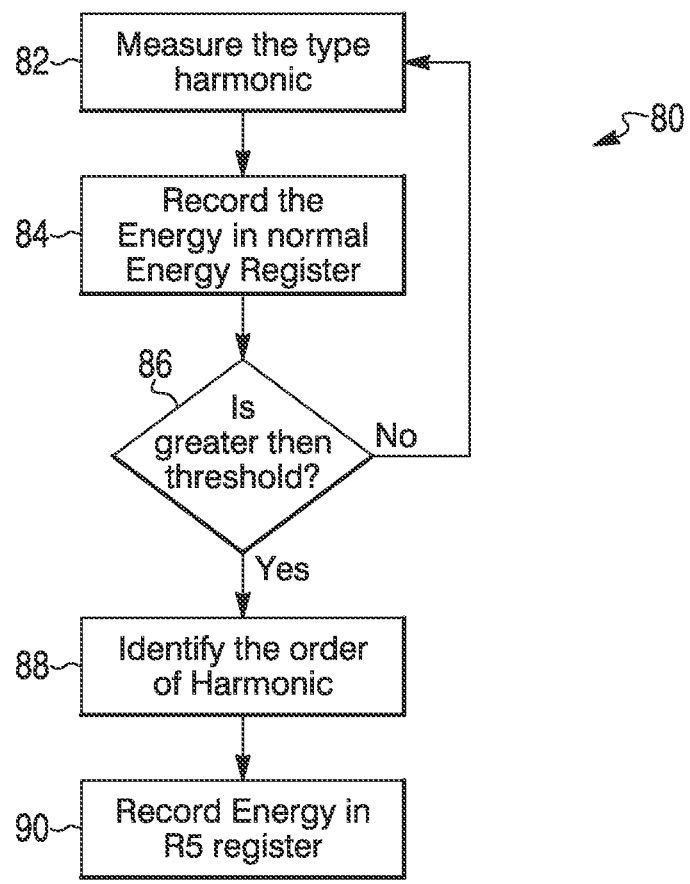
FIG. 4 is a flow diagram showing an illustrative method that may be carried out by the illustrative electric energy meters of FIG. 1.

FIG. 4 is a flow diagram showing an illustrative method 80 that may be carried out by the electric energy meter 10. A type of harmonic is measured, as indicated at block 82. The energy value is recorded in the normal energy register (such as the accumulated power register 30), as indicated at block 84. A determination is made (such as by the controller 18) as to whether the measured harmonic is greater than a threshold. If not, control reverts to block 82. If so, control passes to block 88 and the order of the harmonic is identified. An amount of energy that is delivered to the consumer while the measured harmonic is greater than the threshold is accumulated in R5 register (such as the register 42e), as indicated at block 90.

Figure 5:
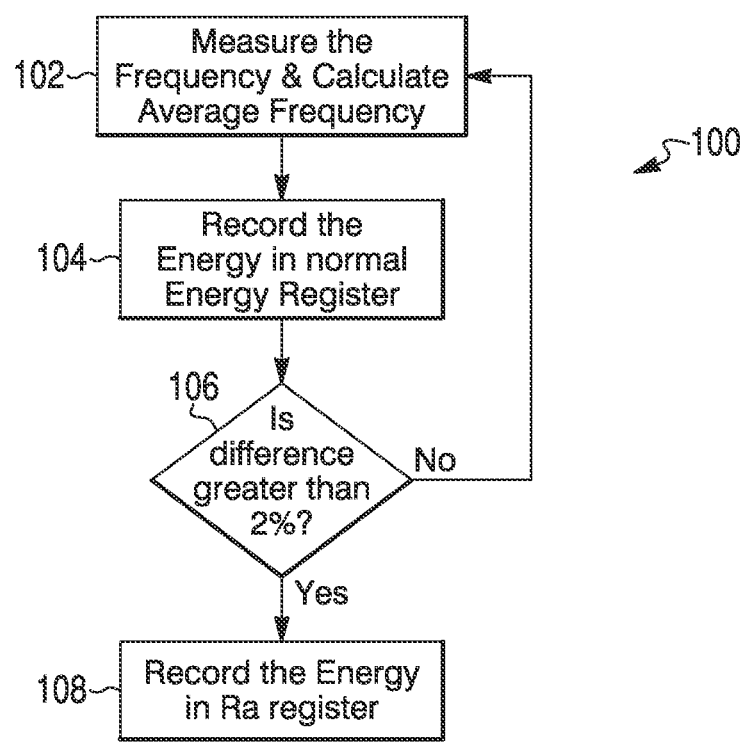
FIG. 5 is a flow diagram showing an illustrative method that may be carried out by the illustrative electric energy meters of FIG. 1.

FIG. 5 is a flow diagram showing an illustrative method 100 that may be carried out by the electric energy meter 10. Frequency is measured and average frequency is calculated, as indicated at block 102. The energy value is recorded in the normal energy register (such as the accumulated power register 30), as indicated at block 104. A determination is made (such as by the controller 18) as to whether the current frequency differs from the average frequency by greater than two percent. If not, control reverts to block 102. If so, control passes to block 108, and an amount of energy that is delivered to the consumer while the current frequency differs from the average frequency by greater than two percent is accumulated in Ra register (such as the register 44a), as indicated at block 108.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. An electric energy meter, comprising:
    a plurality of first terminals for receiving a measure of current of each of one or more phases of power that is delivered to a load;
    a plurality of second terminals for receiving a measure of voltage of each of one or more phases of power that is delivered to the load;
    a controller operatively coupled to the plurality of first terminals and the plurality of second terminals, the controller configured to analyze the measure of current and the measure of voltage of each of the one or more phases of power that is delivered to the load to:
        determine a measure of accumulated power delivered to the load;
        determine one or more power quality issues in one or more of the one or more phases of power that is delivered to the load;
    an accumulated power register operatively coupled to the controller for storing the measure of accumulated power delivered to the load;
    a plurality of power quality monitor registers operably coupled to the controller, the controller saving indications of each of a plurality of different power quality issues in a corresponding one of the plurality of power quality monitor registers, wherein the indications include a value or set of values that represent a measure of accumulated power delivered to the load with the corresponding power quality issue; and a communication port operably coupled to the controller and configured to communicate with an external device, the controller configured to communicate the measure of accumulated power delivered to the load and communicate the indication of each of one or more of the plurality of different power quality issues via the communication port.

2. The electric energy meter of claim 1, wherein the controller is further configured to ascertain whether a particular power quality issue originated upstream of the electric energy meter or downstream of the electric energy meter.

3. The electric energy meter of claim 2, wherein the plurality of power quality monitor registers comprises a first set of power quality monitor registers that each correspond to a different power quality issue originating upstream of the electric energy meter, and a second set of power quality monitor registers that each correspond to a different power quality issue originating downstream of the electric energy meter.

4. The electric energy meter of claim 3, wherein the power quality issues originating upstream of the electric energy meter are attributed to a utility that provides the power that is delivered to the load.

5. The electric energy meter of claim 3, wherein the power quality issues originating downstream of the electric energy meter are attributed to a consumer of the power that is delivered to the load.

6. The electric energy meter of claim 1, wherein the electric energy meter is configured to be installed at a consumer's location that includes the load.

7. The electric energy meter of claim 6, wherein the external device comprises a computing device at the consumer's location.

8. The electric energy meter of claim 6, wherein the external device comprises a computing device of a utility that provides the power that is delivered to the load.

9. The electric energy meter of claim 1, wherein the energy meter is configured to detect sag/swell of one or more phases of power that is delivered to the load.

10. The electric energy meter of claim 1, wherein the electric energy meter is configured to detect a phase unbalance of power that is delivered to the load.

11. The electric energy meter of claim 1, wherein the electric energy meter is configured to detect short interruptions of power that is delivered to the load.

12. The electric energy meter of claim 1, wherein the electric energy meter is configured to detect flickering of power that is delivered to the load.

13. The electric energy meter of claim 1, wherein the electric energy meter is configured to detect one or more harmonics in power that is delivered to the load.

14. The electric energy meter of claim 1, wherein the electric energy meter is configured to detect a frequency of power that is delivered to the load.

15. The electric energy meter of claim 1, wherein the communication port comprises a wireless communication port.

16. An electric energy meter, comprising:
a plurality of terminals for receiving a measure of power consumption for each of one or more phases of power that is delivered to a load;
a controller operatively coupled to the plurality of terminals, the controller configured to analyze the measure of power consumption for each of one or more phases of power that is delivered to the load to:
determine a measure of accumulated power delivered to the load;
determine one or more power quality issues in one or more phases of power that is delivered to the load;
an accumulated power register operatively coupled to the controller for storing the measure of accumulated power delivered to the load;
a plurality of power quality monitor registers operably coupled to the controller, the controller saving indications of each of a plurality of different power quality issues in a corresponding one of the plurality of power quality monitor registers, wherein the indications include a value or set of values that represent a measure of accumulated power delivered to the load with the corresponding power quality issue; and
a communication port operably coupled to the controller and configured to communicate with an external device, the controller configured to communicate the measure of accumulated power delivered to the load and communicate an indication of each of one or more of the plurality of different power quality issues via the communication port.

17. The electric energy meter of claim 16, wherein the controller is further configured to:
ascertain whether a particular power quality issue originated upstream of the electric energy meter or downstream of the electric energy meter; and
wherein the plurality of power quality monitor registers comprises a first set of power quality monitor registers that each correspond to a different power quality issue originating upstream of the electric energy meter, and a second set of power quality monitor registers that each correspond to a different power quality issue originating downstream of the electric energy meter.

18. The electric energy meter of claim 17, wherein the power quality issues originating upstream of the electric energy meter are attributed to a utility that provides the power that is delivered to the load, and wherein the power quality issues originating downstream of the electric energy meter are attributed to a consumer of the power that is delivered to the load.

19. The electric energy meter of claim 16, further comprising a user interface, and the controller is further configured to display the indications of each of a plurality of different power quality issues that are collectively saved in the plurality power quality monitor registers.

20. An electric energy meter, comprising:
a plurality of first terminals for receiving a measure of current of each of one or more phases of power that is delivered to a load;
a plurality of second terminals for receiving a measure of voltage of each of one or more phases of power that is delivered to the load;
a controller operatively coupled to the plurality of first terminals and the plurality of second terminals, the controller configured to:
analyze the measure of current and the measure of voltage of each of the one or more phases of power that is delivered to the load in order to detect power quality issues in one or more of the one or more phases of power that is delivered to the load; and
for each of the detected power quality issues, determine whether the detected power quality issue is caused by a utility generating the power or a consumer consuming the power;
for each of the detected power quality issues, store a value or set of values that represent a measure of accumulated power delivered to the load with the corresponding power quality issue; and communicate a message indicating the detected power quality issues via a communications port operably coupled to the controller.

* * * * *